United States Patent [19]
Sautner

[11] 3,944,792
[45] Mar. 16, 1976

[54] SELF-BALANCING BRIDGE-TYPE PROXIMITY DETECTOR

[75] Inventor: William J. Sautner, Danbury, Conn.

[73] Assignee: Jovill Manufacturing Company, Danbury, Conn.

[22] Filed: Sept. 11, 1974

[21] Appl. No.: 504,905

[52] U.S. Cl. ...... 235/92 PK; 235/92 CW; 235/92 R; 235/98 A; 242/4 R; 324/61 P
[51] Int. Cl.² .......................................... B65H 81/02
[58] Field of Search ......... 235/92 PK, 92 CW, 92 P, 235/98 A; 242/4 R; 324/61 P, 99 R

[56] References Cited
UNITED STATES PATENTS

| | | | |
|---|---|---|---|
| 2,474,156 | 6/1949 | Namenyi-Katz | 235/92 PK |
| 2,919,853 | 1/1960 | Wight et al. | 235/92 CW |
| 3,190,122 | 6/1965 | Edwards | 324/61 P |
| 3,580,521 | 5/1971 | Settanni | 242/4 R |

Primary Examiner—Joseph M. Thesz, Jr.
Attorney, Agent, or Firm—Joseph Levinson

[57] ABSTRACT

A self-balancing capacitance bridge-type proximity detector is provided having a probe in one leg of a bridge network and a variable capacitor in the form of a varactor effect tuning diode in the other leg of the bridge network. A high frequency oscillator is coupled to the bridge network and the output of the network from the two legs is equal when the bridge is in a balanced condition. The outputs of the bridge are applied to a differential amplifier for producing an output therefrom on an imbalance of the bridge network which is caused by a metallic object which is to be detected contacting or coming in close proximity with the probe. The output of the differential amplifier is fed back to the varactor tuning diode, changing the capacity thereof to rebalance the bridge network. The output of the differential amplifier is also fed to a shaper circuit and from there to a counter for counting the imbalances of the bridge caused by objects being detected coming into contact or close proximity with the probe.

1 Claim, 2 Drawing Figures

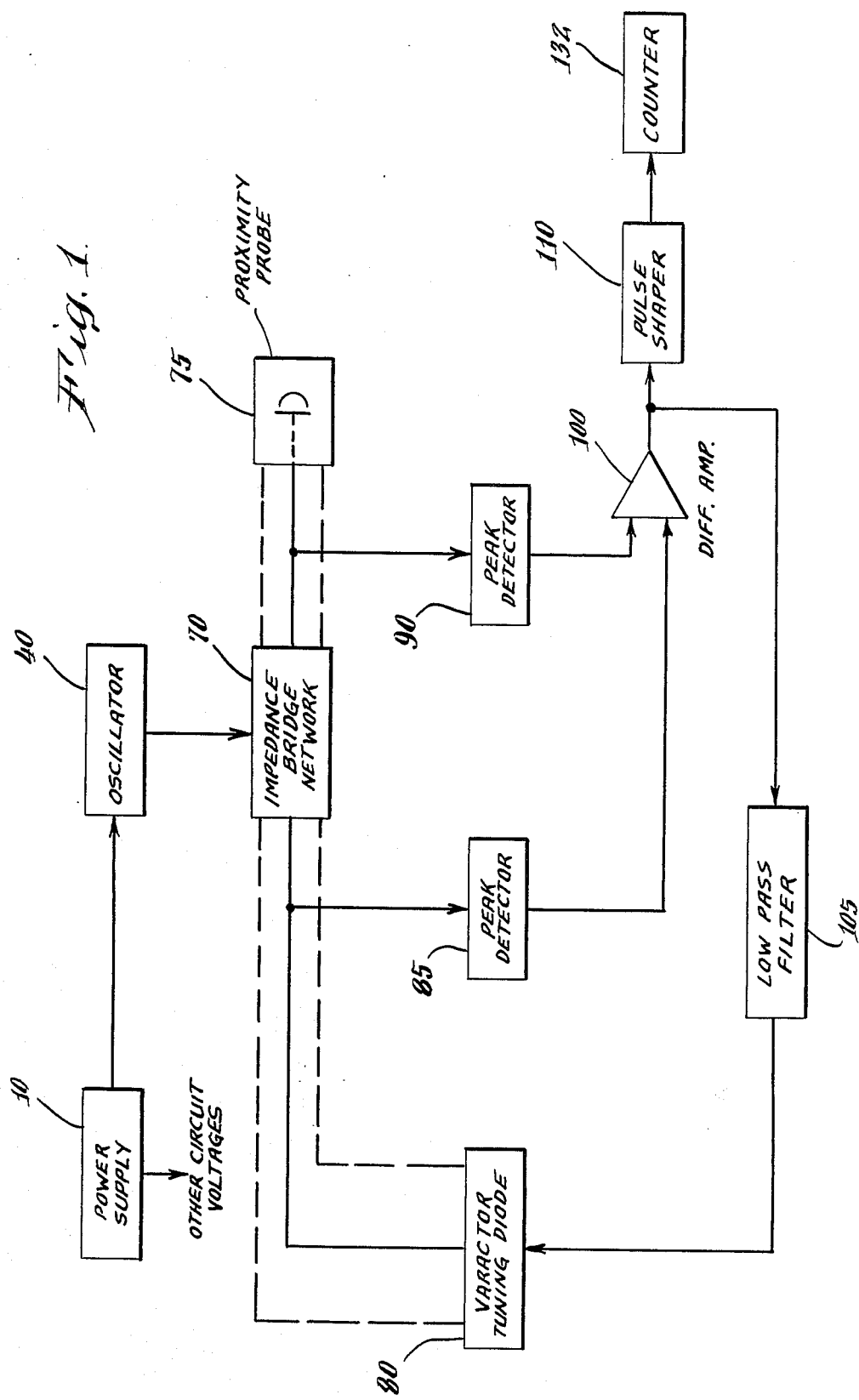

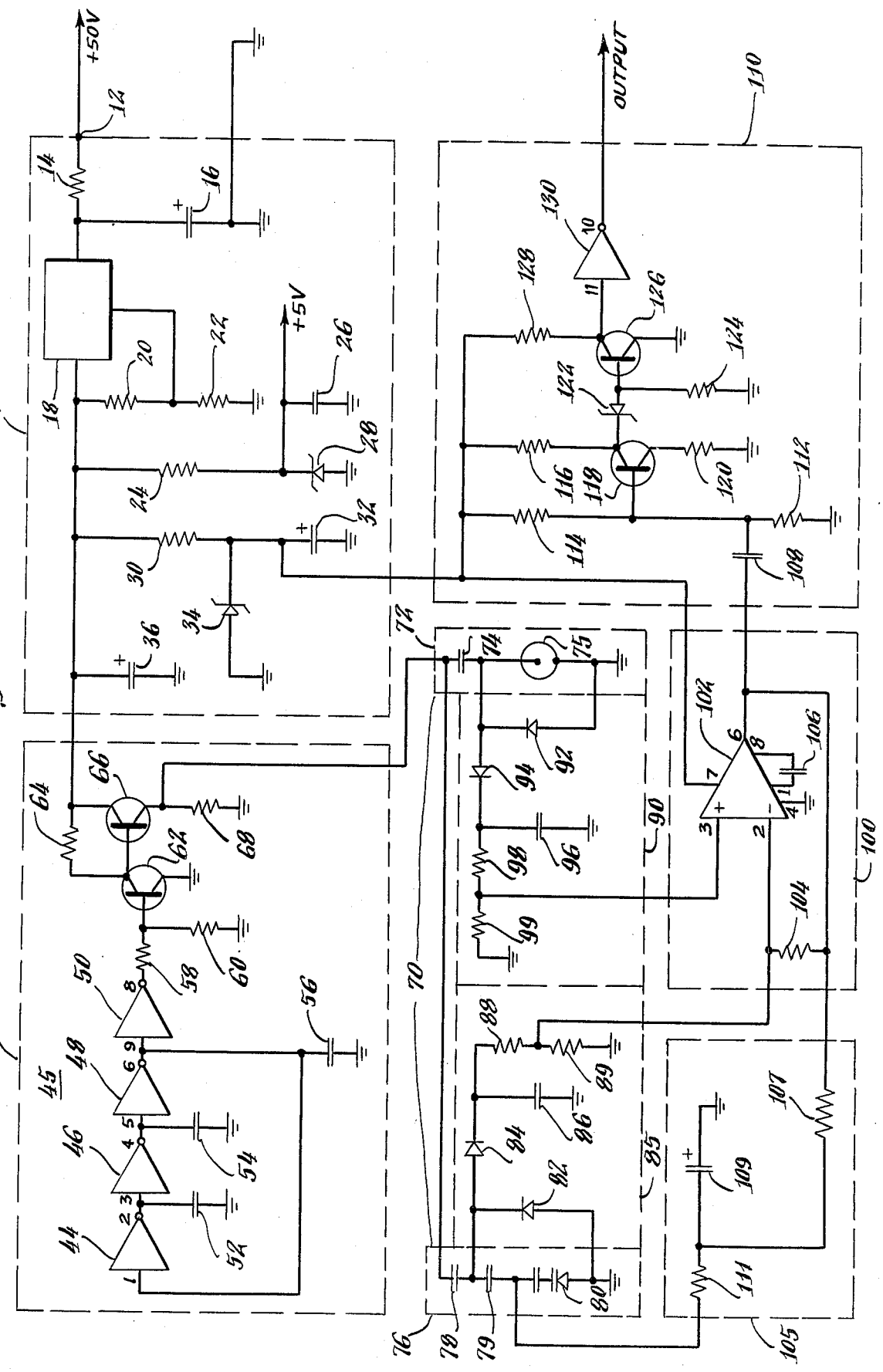

SELF-BALANCING BRIDGE-TYPE PROXIMITY DETECTOR

BACKGROUND OF THE INVENTION

This invention relates to a proximity detector, and more particularly to a self-balancing capacitance bridge type proximity detector in which the bridge is automatically rebalanced when a metallic object which is to be detected unbalances the bridge network.

Proximity detectors have been utilized in a wide variety of applications, ranging from the more simple applications of counting piece parts for controlling manufacturing and packaging processes to the more difficult applications of counting turns of wire being wound on a core. The latter application of counting the number of turns of wire wound on a core by a winding machine is considered a more difficult counting problem due to the speed at which the winding machine operates and the diameter of the wire to be counted, which may be very fine. One approach to this problem is described in U.S. Pat. No. 3,226,531, which utilizes an impedance bridge which is unbalanced upon an approach of a strand of wire, generating a signal which is counted. The problem with this approach is that the impedance bridge must be initially manually balanced. However, the impedance bridge is temperature sensitive, and time unstable, so that it becomes unbalanced even in the absence of a turn of wire which it is designed to detect, thereby requiring an operator to continually check and rebalance the bridge for it to function properly. Accordingly the aforesaid device is subject to error, and requires periodic surveillance to insure that the bridge network is functioning properly.

It is an object of the present invention to provide a new and improved proximity detector which is automatically self-balancing.

A further object of this invention is to provide a new and improved proximity detector which is capable of operating accurately and at high speeds, and without operator intervention.

Still another object of this invention is to provide a new and improved proximity detector which is simple in operation and stable in operation with changes in temperature.

SUMMARY OF THE INVENTION

In carrying out this invention in one illustrative embodiment thereof, a self-balancing proximity detector is provided with a capacitive bridge network which is fed by a high frequency oscillator. The bridge network has one leg which includes a proximity capacitance probe and another leg which includes a variable capacitance means. The output of the two legs of the bridge are fed to a differential amplifier means, producing an output therefrom on an imbalance of the bridge caused by a metallic object being detected in contact or coming into close proximity with the probe. Feedback means are coupled between the output of the differential amplifier and the variable capacitance means for varying the variable capacitance means to rebalance the bridge automatically and thereby conditioning the bridge network for the next approach of a metallic object to be detected.

BRIEF DESCRIPTION OF THE DRAWINGS

FIG. 1 is a block diagram of the self-balancing capacitance bridge-type proximity detector embodied in this invention.

FIG. 2 is a schematic diagram illustrating one form of circuitry in accordance with the proximity detector of this invention.

DESCRIPTION OF THE PREFERRED EMBODIMENT

Referring now to FIG. 1, a power supply 10 is provided which produces the required voltages to operate the proximity detector circuitry. The power supply may be of a conventional type, which may be varied in accordance with the application and the specific requirements of the circuitry. One form of a suitable power supply for a given application will be set forth hereinafter. The power supply 10 is coupled to an oscillator 40 which may be of conventional type for producing a high frequency sinusoidal output voltage of sufficient amplitude to drive an impedance bridge network 70. The impedance bridge network 70 represents an impedance bridge of fixed value capacitors, one leg of which includes a variable capacitance pickup probe 75 and the other leg of which includes a variable capacitance device preferably in the form of a varactor tuning diode 80. The probe 75 is in the form of a coaxial cable connected probe assembly which changes its capacitance when in close proximity or in contact with a metallic object. The varactor tuning diode 80 provides a terminal capacitance which changes with impressed voltage, and is used to balance the impedance bridge network 70. The output of the impedance bridge 70 is coupled to separate peak detector circuits 85 and 90 which rectify and filter the sinusoidal voltages across the outputs of probe 70 and varactor effect tuning diode 80. The DC voltages generated by the outputs of peak detector circuits 85 and 90 are applied to a high gain differential amplifier 100 which provides amplification for the difference in voltage supplied to its input from peak detector circuits 85 and 90. The low pass filter 105 is connected between the output of differential amplifier 100 which removes rapid transient voltages and provides stability for the differential amplifier 100 with the output of the filter being applied to the variable capacitance diode 80. The output of the differential amplifier 100 is applied to a pulse-shaper 110 which functions to shape the rapid transient voltage output of the differential amplifier 100 into a voltage pulse which is compatible with the input requirements of an electronic pulse counter 132. The counter 132 is conventional, and may be of any suitable type to provide the necessary counting function for any given application.

For a detailed description of one form of circuitry which may be utilized for the block diagram shown in FIG. 1, reference is now made to FIG. 2. In an illustrated form for purposes of disclosure, the power supply 10 comprises a resistor 14 and a capacitor 16 which are coupled to a source of DC voltage, for example 50 volts, and are used to reduce and filter the input voltage to less than 30 volts DC which is applied to an integrated circuit voltage regulator package 18. Resistors 20 and 22 feed back from the output of the integrated circuit voltage regulator 18 to a sense terminal thereon a portion of the output voltage of the regulator 18 for producing 18 volts DC at the output terminal of the regulator 18. A capacitor 36 is coupled to the output of the regulator for filtering the 18 VDC used by the high frequency oscillator 40. A resistor 24, zener diode 28, and a capacitor 26 are coupled to the output of the regulator package 18 for deriving and filtering a 5 VDC voltage source from the output of the regulator 18, which is used by the high frequency oscillator 40 and the pulse shaper circuit 110. A resistor 30, zener diode 34, and capacitor 32 are coupled to the output of the regulator package 18 for deriving and filtering a 12 VDC source from the output of the regulator 18 which is used by the differential amplifier 100 and the pulse shaper 110. As will be apparent to those skilled in the art, other forms of power supply may be used, depending on the voltages available and the type of application in which the proximity detector is employed.

The high frequency oscillator 40 is illustrated in the form of a ring oscillator comprised of three inverter sections 44, 46 and 48 of a hex inverter digital integrated circuit designated with the reference numeral 45 connected in an input-to-output fashion so as to insure instability and thus maintain oscillation. Capacitors 52, 54, and 56 are used to provide near equal delays to the output of each inverter section 44, 46 and 48 for adjusting the frequency of oscillation to approximately 7 MHz, although this frequency is not critical to proper circuit operation. An additional inverter section 50 is coupled to the output of inverter section 48 to buffer the output of the aforesaid ring oscillator and to drive a high level switching transistor 62 through a resistor divider comprised of resistors 58 and 60. The output of switching transistors 62 drives transistor 66 which is connected in an emitter follower configuration through resistor 64 when transistor 62 is switched off. A resistor 68 connected to the emitter of transistor 66 provides a path of DC current for transistor 66 when it is driven into a conducting state. The output of the emitter follower transistor 66 drives the impedance bridge 70.

The impedance bridge 70 is comprised of two legs 72 and 76. Leg 72 includes capacitor 74 and the capacity of proximity probe 75. Leg 76 includes a capacitor 78, the series equivalent capacity of capacitors 79 and the varactor effect tuning diode 80. The common drive input node to the bridge 70 is the junction of capacitors 74 and 78. The outputs of the bridge 70 are the juncture of capacitors 78 and 79 of leg 76, and the diodes 82 and 84; and the juncture in leg 72 between the capacitors 74 and the center conductor capacitance of the proximity probe 75 and cable, and the diodes 92 and 94. When the bridge 70 is in balance, the amplitudes of the high frequency sinusoidal voltage supplied by the oscillator 40 at the bridge outputs will be equal.

The peak detector circuits 85 and 90 are utilized to convert the peak amplitudes of the above described bridge 70 output signals to proportionally filtered DC voltages. Diodes 84 and 94 in peak detector circuits 85 and 90, respectively, are provided to rectify the sinusoidal signals from the bridge network 70, while diodes 82 and 92 are used to provide discharge paths for the respective outputs of the impedance bridge 70. Capacitors 86 and 96 of peak detector circuits 85 and 90, respectively, are for filtering the rectified sinusoidal output signals from the detecting diodes 84 and 94 respectively, and for retaining the peak voltage values. Resistor dividers 88 and 89, and 98 and 99 are provided to attenuate DC voltages present on the filter capacitors 86 and 96, respectively. Resistor 88 also serves as a gain-determining resistor for the differential amplifier 102, and since the peak detector circuits 85 and 90 are matched in characteristic, resistor 88 is equal in value to resistor 98, and resistor 89 is equal in value to resistor 99.

The differential amplifier circuit 100 is utilized to provide voltage amplification of 60 db (1000 times) to the difference in voltage at the terminals of capacitors 86 and 96. A resistor 104 and the resistor 88 determine and limit the amplifier gain of amplifier 102 to approximately 60 db. A capacitor 106 coupled to the differential amplifier 102 is used to limit the frequency response of the amplifier 102. The amplifier 102 is a linear integrated circuit operational amplifier of conventional type.

The low pass filter 105 is comprised of resistors 107, 111, and a capacitor 109 which is utilized to couple the output from the amplifier 102 to the varactor effect tuning diode 80. The time constant of resistor 107 and capacitor 109 is chosen to guarantee feedback loop stability and at the same time delay the time required to rebalance the bridge 70 after its balance has been disturbed by a wire or other metallic object passing near or contacting the proximity probe so that the resulting amplifier 102 output signal can be used to generate a pulse through the pulse shaper circuitry 110. Merely by way of example, for one application the resistor 107 may be 1 megohm and the capacitance of capacitor 109 may be 22 microfarads. This time constant could easily accommodate the counting of a winding machine wrapping 2500 turns of wire a minute.

The diode 80 is a varactor effect tuning diode whose terminal capacitance decreases proportionately with an increasing inverse bias voltage. The capacitor 79 is used to prevent the DC bias voltage on the tuning diode from appearing on one output of the impedance bridge 70. In the absence of a wire or other metallic object in proximity to the pickup probe 75, or if a wire or metallic object is present but a substantial time has passed for the feedback loop to rebalance the bridge 70, the reverse bias voltage on the tuning diode 80, as determined by the DC output voltage from the amplifier 102 after passing through the low pass filter 105, will be whatever is required to balance the bridge 70 an thus present near equal DC input voltages to the amplifier 102. Although other forms of variable capacitors and means for changing their value might be utilized in response to a voltage, the varactor effect tuning diode 80 is preferred in the present application due to its simplicity, operating range, and quick response. The capacitance of the diode 80 can be varied 10 times for a 10-volt change, which provides a wide operating range.

A capacitor 108 connected to the output of differential amplifier 102 couples the transient signal at the output of the amplifier 102 when the bridge 70 is momentarily unbalanced to the input stage of the pulse shaper circuit 110 comprised of base-biasing resistors 112 and 114, transistor 118, collector and emitter resistors 116 and 120, respectively. Transistor 118 of this input stage provides a voltage gain of 14 db (5 times) to the amplitude of the transitory signal on the base of transistor 118. The value of the resistors 112, 114, 116 and 120 are chosen so that the collector of transistor 118 is less than 6 VDC without a changing signal present at the base of transistor 118. When a wire or other metallic object passes near the probe 75, the bridge 70 is unbalanced and a negative-going signal of greater than 1 volt at the base of transistor 118 causes the collector of transistor 118 to go to 12 volts, which is coupled through a zener diode 122 and resistor 124 causing a transistor 126 to conduct. The conduction of transistor 126 causes the collector terminal of transistor 126 to go from a voltage of near 12 volts to a potential of near 0 volts. This potential is coupled to the input of an inverter 130 which is a section of the hex inverter circuit assembly 45, causing the output of the inverter section 130 to go to a voltage of +5 volts. This positive-going signal is coupled to the electronic pulse counter 132 shown in FIG. 1 for the purpose of counting the total number of wire passages. When the wire leaves the proximity of the probe 75 tip, or a substantial time has passed for the feedback loop to rebalance the bridge 70, the collector voltage of transistor 118 falls below 6 volts, and zener diode 122 ceases to conduct. Accordingly, transistor 126 switches to an off state with resistor 128 providing a path to +12 volts for the input of the hex inverter buffer stage 130 and the collector of transistor 126. The output of the hex inverter section 130 then returns to near 0 volts.

Although it will be apparent that different components and component types may be utilized in the present invention, in the illustrated embodiment and for purposes of disclosure, several of the components or integrated circuits of the schematic diagram shown in FIG. 2 may be of the following types:

- voltage regulator package 18 — National Semiconductor LM309H;
- hex inverter integrated circuit 45 — National Semiconductor SN7404N;
- diode 80 — Motorola MV1404;
- operational amplifier 102 — Fairchild Semiconductor MA748;
- transistors 62, 66, 118, 126 — National Semiconductor 2N5133.

As will be seen from the above description, the bridge circuit 70 is self-balancing. On the approach of a wire or other object to be detected, close proximity to the probe 75 unbalances the impedance bridge 70. The unbalanced outputs of the impedance bridge are fed from legs 72 and 76 of the impedance bridge through peak detector circuits 90 and 85, respectively, to the input of the differential amplifier 102. The difference signal appearing at the output of the amplifier 102 is applied from the pulse shaper circuit 110 to a counter 132. At the same time, the output from the differential amplifier 102 is applied via the low pass filter 105 to the tuning diode 80, providing a changing bias thereon which changes the capacity of the leg 76 of the bridge 70 to automatically rebalance the bridge and ready the bridge for another count produced by another unbalance of the bridge caused by a metallic object or wire moving in close proximity to the probe 75. Since the bridge 70 is self-balancing, no manual balancing of the bridge is required, and the effects of time do not affect the self-balancing operation. Also, changes in temperature will not unbalance the bridge, since the self-balancing feature will automatically compensate for changes in probe cable capacitance due to dielectric constant changes with temperature.

Although the device is operative as a proximity probe, it will be apparent that the object which is to be counted may actually touch the probe if desired, or by accident, without disturbing the count. For some applications it may be desirable for the object to be counted to brush the probe. However, it should be understood that the present invention is applicable to those applications as well as to approaches of metallic objects in close proximity with the probe. Although the invention has referred to the wire counting application, it will be apparent that the proximity probe will work with any type of metallic object coming into close proximity with the probe. Also, the invention may be applicable to variable-type counting operations, and is not restricted to the high-speed counting operations required for counting turns of wire wound by a coil winding machine.

Since other modifications and changes, varied to fit particular operating requirements and environments, will be apparent to those skilled in the art, the invention is not considered limited to the examples chosen for purposes of disclosure, and covers all changes and modifications which do not constitute departures from the true spirit and scope of this invention.

I claim:

1. A self-balancing capacitance bridge-type proximity detector having a probe forming a leg of the bridge for providing an output when a metallic object contacts or passes in close proximity to the probe, comprising in combination a. a high frequency oscillator,
    b. a capacitance bridge network having a proximity capacitance probe in one leg of said bridge network and a varactor effect tuning diode in a second leg of said bridge network, said high frequency oscillator having the output thereof coupled to said first and second legs of said bridge network,
    c. a differential amplifier means coupled to said first and second legs of said bridge network for producing an output therefrom on an imbalance of said bridge network caused by a metallic object to be detected contacting or coming into close proximity to said probe,
    d. feedback means having a low pass filter which has a time constant producing a time delay in rebalancing said bridge network, said feedback means being coupled between the output of said differential amplifier means and said varactor effect tuning diode for varying the capacitance of said varactor effect tuning diode to rebalance said bridge network, thereby conditioning said bridge network for the next approach of the metallic object to be detected, and
    e. peak detector means coupling said first and second legs of said bridge network to said differential amplifier for converting the peak amplitude of the outputs of said first and second legs of said bridge network to proportional DC voltages which are coupled to the inputs of said differential amplifiers.

* * * * *